US008045163B2

(12) United States Patent
Grau

(10) Patent No.: US 8,045,163 B2
(45) Date of Patent: Oct. 25, 2011

(54) METHOD FOR PRODUCING POLARISATION FILTERS AND USE OF POLARISATION-SENSITIVE PHOTO-SENSORS AND POLARISATION-GENERATING REPRODUCTION DEVICES

(76) Inventor: Gunter Grau, Dorsten (DE)

( * ) Notice: Subject to any disclaimer, the term of this patent is extended or adjusted under 35 U.S.C. 154(b) by 833 days.

(21) Appl. No.: 11/995,018

(22) PCT Filed: Jun. 22, 2006

(86) PCT No.: PCT/EP2006/063435
§ 371 (c)(1),
(2), (4) Date: Jan. 8, 2008

(87) PCT Pub. No.: WO2007/006630
PCT Pub. Date: Jan. 18, 2007

(65) Prior Publication Data
US 2010/0118398 A1     May 13, 2010

(30) Foreign Application Priority Data
Jul. 8, 2005 (DE) .......................... 10 2005 031 966

(51) Int. Cl.
*G01J 4/00* (2006.01)
*G02B 5/30* (2006.01)
(52) U.S. Cl. .................... 356/364; 356/370; 359/485.05

(58) Field of Classification Search ........... 356/364–369
See application file for complete search history.

(56) References Cited

U.S. PATENT DOCUMENTS

| 5,038,041 A | 8/1991 | Egan |
| 5,327,285 A | 7/1994 | Faris |
| 6,144,512 A | 11/2000 | Eden |
| 6,375,870 B1 | 4/2002 | Visovsky et al. |
| 2003/0142400 A1 | 7/2003 | Hansen et al. |
| 2003/0146374 A1 | 8/2003 | Bois et al. |
| 2004/0120041 A1 | 6/2004 | Silverstein et al. |

FOREIGN PATENT DOCUMENTS

| DE | 1 015 236 | 9/1957 |
| DE | 40 26 892 A1 | 2/1992 |
| DE | 41 14 229 A1 | 4/1992 |
| DE | 690 29 683 T2 | 8/1997 |
| DE | 689 27 986 T2 | 11/1997 |
| DE | 696 01 621 T2 | 6/1999 |
| DE | 199 33 843 B4 | 3/2001 |
| DE | 100 26 080 A1 | 12/2001 |
| GB | 2 026 713 A | 2/1980 |

*Primary Examiner* — Layla Lauchman
(74) *Attorney, Agent, or Firm* — Rankin, Hill & Clark LLP

(57) ABSTRACT

The present invention relates to methods for manufacturing polarization sensitive respectively polarizing filters and to their application to polarizing photosensors used to measure the polarization of incident light, further to designs of polarization sensors measuring angles of rotation and strong electric or magnetic fields as well as to reproducing polarization equipment reproducing polarized signals or to reproduce independent signals.

24 Claims, 12 Drawing Sheets

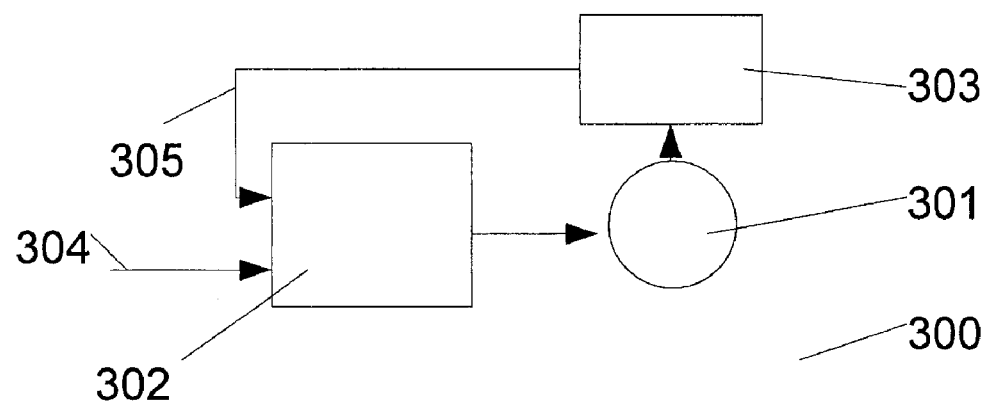
Fig. 3)

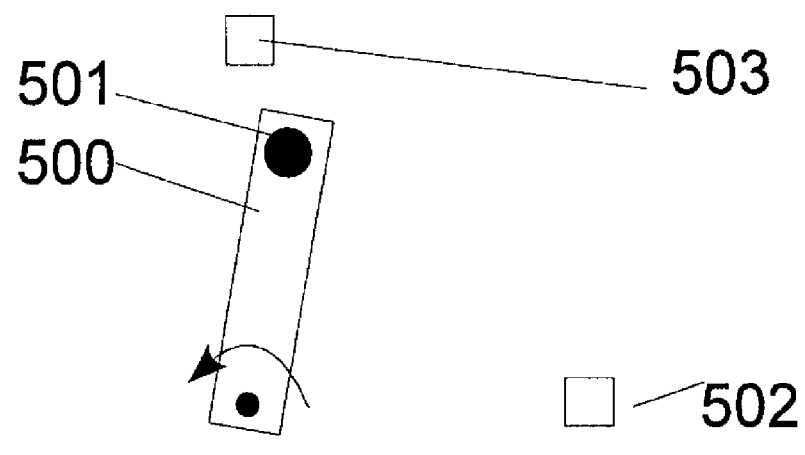
Fig. 5)

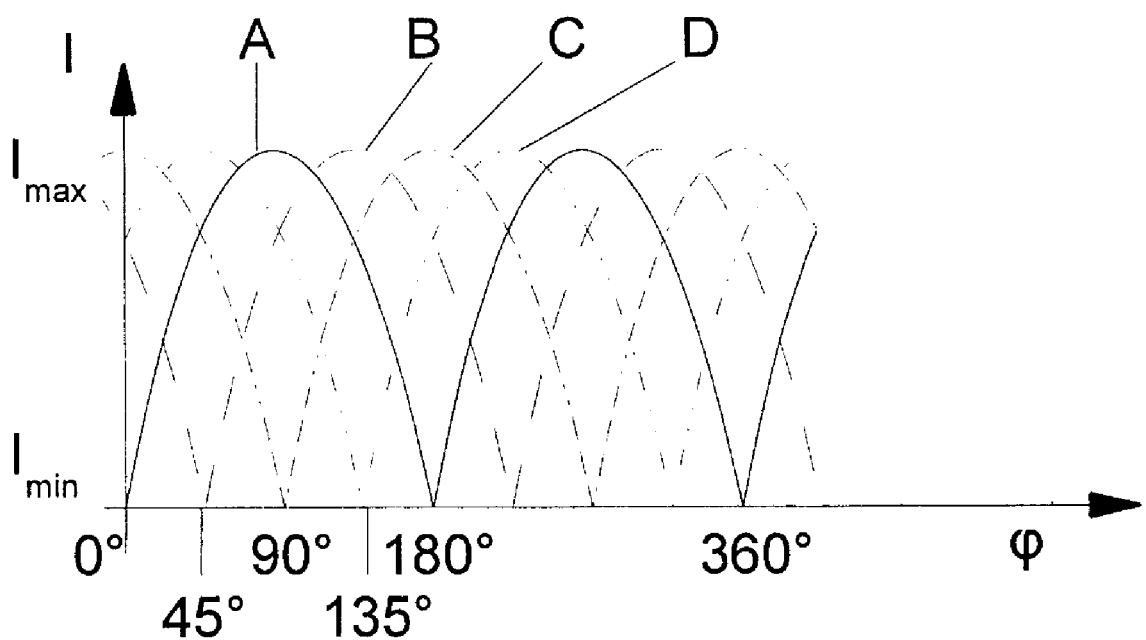
*Fig. 6)*

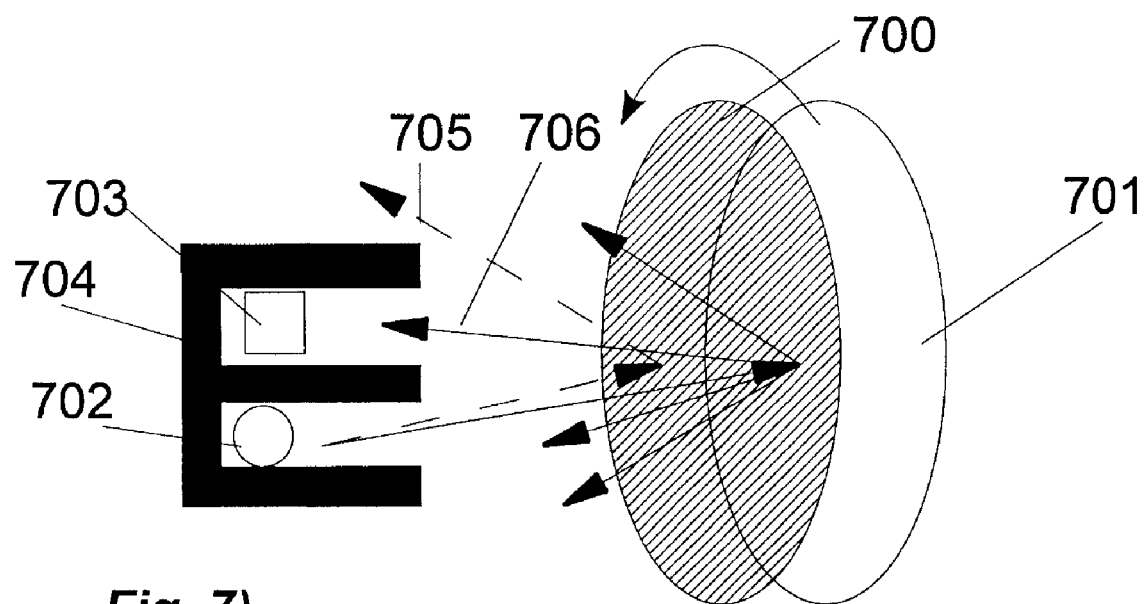
*Fig. 7)*

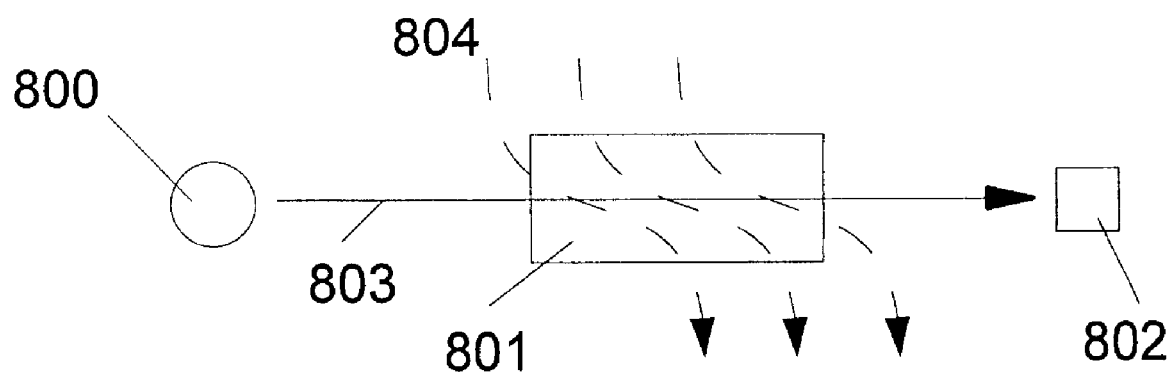
Fig. 8)

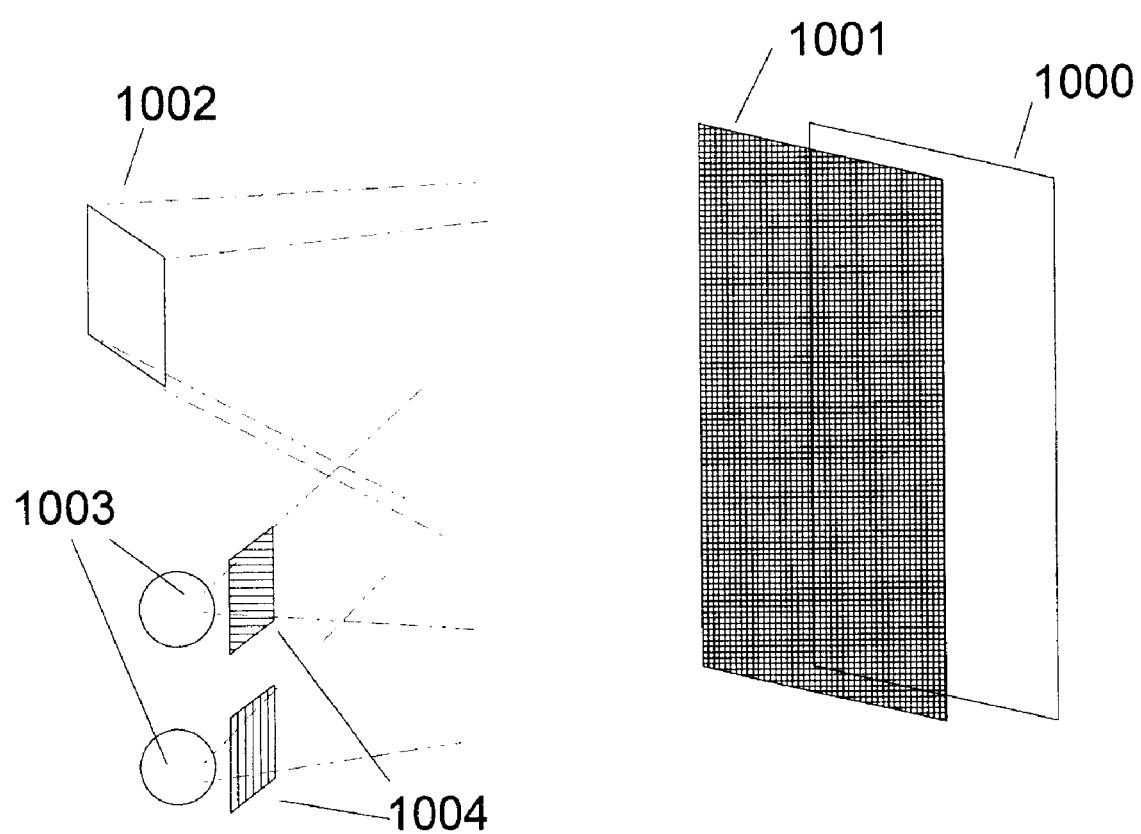
Fig. 10)

METHOD FOR PRODUCING POLARISATION FILTERS AND USE OF POLARISATION-SENSITIVE PHOTO-SENSORS AND POLARISATION-GENERATING REPRODUCTION DEVICES

FIELD OF THE INVENTION

The present invention relates to manufacturing methods of polarization-sensitive respectively polarizing filters, further to application of polarization-sensitive photosensors to measure the incident light polarization, embodiments of polarization sensors to measure angles of rotation and strong electrical or magnetic fields and further to polarization generating reproducing apparatus to reproduce polarized signals or to the reproduction of independent signals.

BACKGROUND

Polarization is an important property of light ordinarily not detected by the human eye. Whereas insects already for a long time find their way using the sky's scattered polarized light, humans have exploited polarization only lately. Sun glasses specifically suppress the sky's scattered light. Photographers place polarizing filters in front of the camera lens to suppress reflections from glass panes or other surfaces. Streak photography is significant in quality control, for instance rendering visible stresses in a glass bottle. It is also known that the light transmitted through two linear polarization filters depends on the relative rotation between the two filters, the light intensity obeying Malus law of the $\cos^2$ of the angle. This law can be applied to measure angles and in display means.

Probably at this time the most important field of application of polarizers is in the display technology. Liquid crystal displays (LCD's) make use of large-area polarization filter sheets with a constant direction of polarization in order to create a change between bright and dark by optical rotation or reversal of orientation in a liquid crystal between two such polarizing filter sheets. Large scale production of polarizing filters is no longer a problem. Such a polarized filter sheet operates on the principle to align for instance long-chain molecules serving as microscopic antennas parallel to each other by mechanical processing (rolling, stretching, rubbing, external electric or magnetic fields) during their manufacture. If light is incident in a manner that the plane of oscillation of the electric field runs parallel to the molecules acting as microantennas, then said light shall cause a current. As a result and depending on the nature of these micro-antennas the light is reflected or absorbed. On the other hand no significant interaction takes place in the transverse direction, and the light is transmitted. Polarization dependence presupposes the distances between the micro-antennas are sufficiently small relatively to the light wavelengths. Illustratively such manufacturing procedures are described in DE 696 01 621 T2 which also discusses the quality and life of such sheets, in DE 690 29 683 T2 and in DE 689 27 986 T2 also describing manufacturing polarizing filters according to pattern. DE 41 14 229 A1 describes industrial, large-scale manufacture of polarizing cast sheets at high manufacturing rates. DE 40 26 892 A1 describes further classes of cast sheets. DBP 1 015 236 describes a manufacturing method allowing extending the polarization into the far infrared. DE 199 33 843 B4 discusses manufacturing LCD's using unstructured polarizing filter sheets, describing therein the lithographic structure of electrode materials.

Manufacturing polarizer details, in particular polarized zones of controlled alignments, is difficult. It is uneconomical to cut into small pieces a polarizing filter sheet and to put it together like parts of a puzzle, and moreover it is not precise enough as regards adjustment tolerances. Nano-technology is still a young branch and relates in part to the manufacture of optical gratings and nano-tubes or nano-wires frequently made of carbon or iron (T. P. Hülser et al, "Self-assembled Iron Nanowires: Morphology, Electrical and Magnetic Properties", Materials Research Society Symposium Proceedings Vol. 877E, 2005), however controlling the manufacture is far from a simple manner. Moreover problems are encountered when aligning the structures so made. It is uneconomical in the present state of the art to manufacture a micro-array of polarizers with deliberate different orientations. DE 100 26 080 A1 describes a procedure whereby an initially a large-area homogeneously polarized sheet loses its polarizing action at some sites due to selective post-processing, and a procedure of assembling several such sheets into one polarizing filter which is multi-directionally polarizing. Besides damping, the filter weight also increases with each additional layer, and it is difficult to accurately adjust and affix sheets prepared in this manner on a support/substrate. The above document also describes controlling the polymerization of an initial material by irradiating it with polarized light, but qualitatively such polarization is less effective than that obtained by mechanical processing.

There are a number of applications measuring angles of rotation employing an equal number of measurement procedures. A frequently encountered problem is measuring the angles of rotating parts for instance to ascertain the position of a transducer (control stick, pedal etc.) or of a servo.

A servo 300 receives a reference value 304, for instance a predetermined angle, and must convert said default into a mechanical position (FIG. 3). For that purpose this servo is fitted with a sensor 303 and a control circuit 302 appropriately driving the servomotor 301. Conventional servos use a potentiometer for the measurement. This potentiometer is connected to the shaft of a motor or to gearing and allows measuring for instance an angle of rotation. A conventional potentiometer is made of an electrically conducting graphite or an electrically conducting plastic arcuate segment fitted with electrical terminals at both ends. A mechanical wiper makes point contact with the arcuate conducting segment and taps the voltage at its contact point. Depending on the angle of rotation, the potentiometer acts as a voltage divider with a voltage division ideally between 0 and 100% representing a comparison value to the 0 to 100% position information. There is an obvious problem in mechanical wear because said wiper must touch the surface. Also the wiper must be mounted in play-free manner on a shaft. The servo must overcome a frictional force to displace the wiper and this feature may be problematical in miniature servos. Potentiometers again are unsuitable in applications requiring free rotations.

Just as frequently a solution must be found to measure an angle when using a forked light barrier [slotted interrupter] 400 in combination with a slotted stop (aperture) 404 or coding disk (FIG. 4a). Considering that typically only relative changes in position are measured (absolutely coded coding disks are expensive/complex and very laborious in signal detection), the generation of a digital signal for control purposes is not necessarily helpful. The servo's positioning accuracy is determined by the number of slits per revolution on the stop. There are limits on arbitrary increases, because entailing ever increasing adjustment accuracy and the susceptibility to soiling and damage rising markedly. Such limitations may be overcome either by using mechanical gearings or increasing the size of the slotted stop. Both desiderata are impeded by miniaturization and cost reduction. Also there are inductive and capacitive position sensors 411 operating by counting voltage peaks as the gear teeth 410 move past them (FIG. 4b) and thereby they basically also raise the same problems. It is possible to measure angles in analog manner within a limited angular range (only several tens of degrees) by proximity sensing/measuring two different reference positions 502, 503 and a signal generator 501. In this manner the ratio of two inductive or capacitive test values may be converted into a signal related to the position of display element 500 in the manner of a potentiometer, however without mechanical wear and friction (FIG. 5). Again the limitation to narrow angles and the spatial bulk of the test unit conflict with miniaturization. All the above discussed systems incur further drawbacks. Measurement accuracy, i.e. sensor operation, depends on mechanical tolerances. Also, none of the above measurement principles is appropriate at exceedingly high rotational speeds.

Various competing methods are available to reproduce stereoscopic images, such reproduction being one of the applications of the present invention. DE 199 24 096 C2 employs three primary colors (R/G/B) and one holographic screen together with orthogonal polarizers to implement position-independent viewing of a projected stereo image. Optical modulators and phase plates in the light path allowing changing between different planes of polarization. However miniaturizing is feasible only in limited manner in this design. DE 195 10 671 A1 describes an LCD screen able to generate different proportions of orthogonal polarization directions at each pixel. This design employs a kind of double LCD structure, the first structure being dedicated to intensity and color, the second structure to re-orient the polarized light or the proportionate resolution into orthogonal components. However mechanical problems, problems in adjustment and weight are likely in this design even though it is a significant improvement over the three alternatives discussed in this document and in particular being free of a reduction in resolution or in the image rate. Yet this effect is attained not by site-selective polarization filters but by site-selective control of liquid crystals. Controlling this display entails a special computation stage wherein the individual pictures are appropriately superposed. Presumably entirely independent image contents for the left and right eyes or for different observers cause/produce artifacts because of unavailability of independent pixels. Conceivably individual pixels might be driven in fixed, stationary manner to attain a matrix with differently polarized LCD pixels. In that case, on the other hand, the screen resolution would be reduced. Nor is it clear how precisely the second LCD layer is able to rotate the light, that is, how completely the partial images might be separated.

DESCRIPTION OF DRAWINGS

The invention is elucidated below in relation to illustrative implementations/embodiments and to the appended drawings.

FIG. 3 shows a servo system of the state of the art, FIG. 5 shows a relative, inductive or capacitive measurement of the state of the art, FIG. 6 shows the angular function of the individual sensor signals of the present invention, FIG. 7 shows angle measurement with a reflecting polarization filter of the present invention, FIG. 8 shows a device of the present invention measuring strong fields, FIG. 10 shows an image projector with a polarization matrix of the present invention.

DISCLOSURE OF THE INVENTION

Figure 1A:
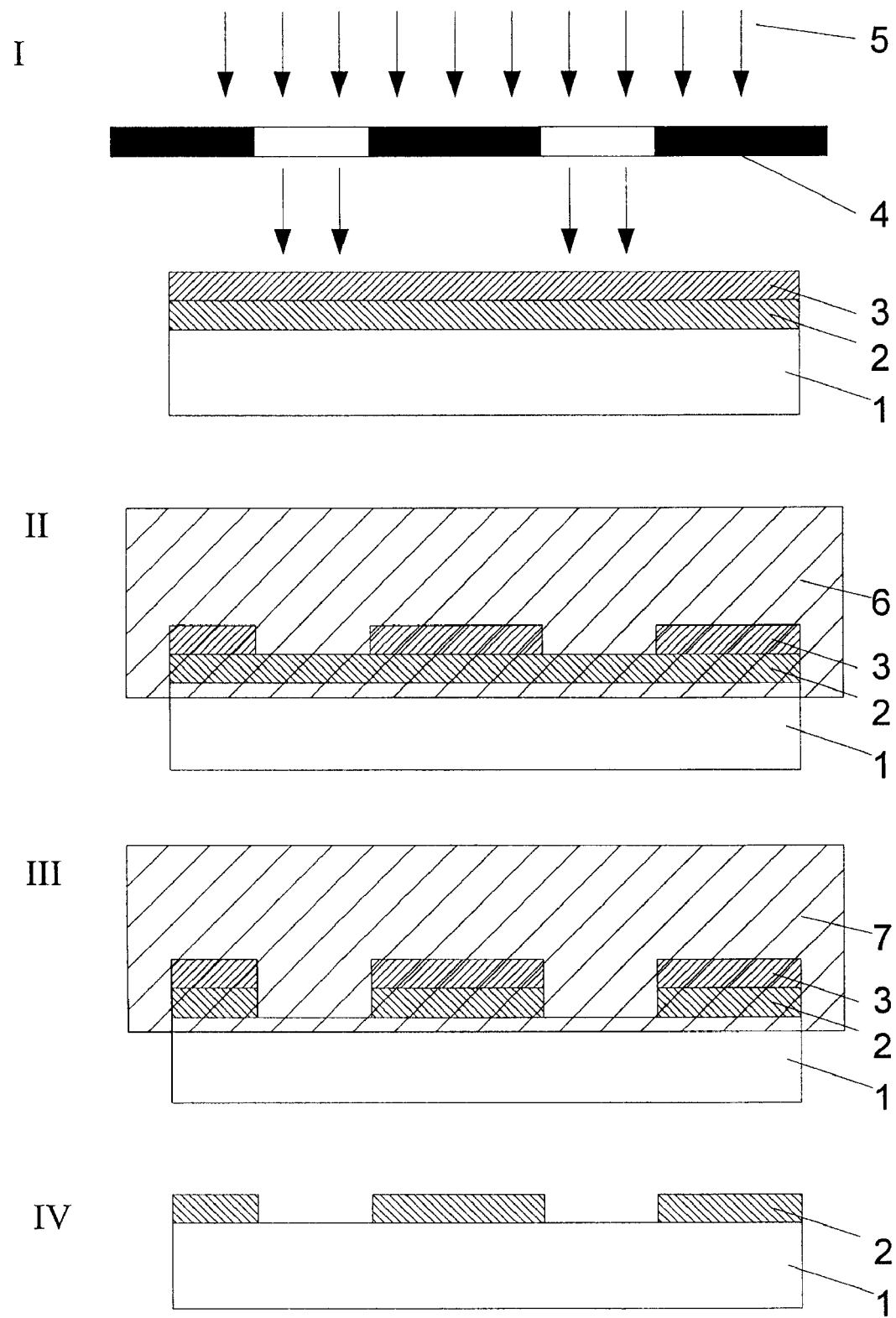
FIG. 1a shows the sequence of processing steps structuring a plating plane of the state of the art and according to the present invention.

Accordingly it is the objective of the present invention to create methods appropriate to manufacture narrowly bounded polarization filters directed in predetermined manner and to describe on that basis illustrative modes of implementation of which the application heretofore has been fairly problematical.

The above goal is attained in a first disclosure of the present invention by a method for manufacturing a polarization sensitive filter of controlled size and rotation employing lithographic methods to create grating structures in at least one plane of manufacture and/or wiring plane of which the geometry and orientation were previously determined when planning mask data, preferably only those manufacturing steps and conventional structural sizes being used that are part of integrated circuit design.

The essential assumption in this respect is that the smallest structures that may be manufactured shall be smaller than the polarizing light wavelength. For infrared (IR) light, this is the case for instance with 130 nm technologies. As regards lithographic manufacture, CAD made structures are transferred to an exposure mask. Following coating a wafer with a light sensitive lacquer, i.e. a photoresist, the photomask is used to protect given photoresist zones against subsequent exposure. Next the exposed respectively unexposed zones of the photoresist are etched away. In this manner controlled wafer zones are made accessible to other manufacturing steps. If for instance a polarization filter should be manufactured in a metallization plane, metal is evaporated over the full wafer surface before the photoresist is deposited. Following photoresist deposition and etching free the zones defined by the exposure mask, the metal is etched away in the zones no longer protected by the photoresist. When next the residual photoresist is removed, the metallization structured according to the CAD data remains. Present-day technologies comprise several wiring planes. However only little contrast is available in structures of the order of 100 nm.

The above discussed problem is solved in a second disclosure of the present invention by a manufacturing method for a polarization sensitive filter of controlled size and orientation, where a polarized substance of predetermined direction of polarization is deposited on a photoresist coated substrate at a given angle to this substrate and while being subjected to at least one controlling physical and/or chemical control factor such as pressure, temperature or the like, given substrate zones being freed for instance by exposure and etching of the photoresist, and where, following hardening and/or cooling the polarized substance on the substrate, the excess polarized material and/or photoresist of the still covered zones is removed by etching and/or polishing.

The polarized substance of predetermined direction of polarization may have been manufactured beforehand using procedures conventional in making large area polarization sheets, for instance for LCD's. Illustratively a material consisting of long-chain molecules, nano-tubes or nanowires, when being mechanically processed, for instance by elongation or rolling, will offer polarization properties because the long-chain molecules, nanotubes or nanowires will line up parallel to each other. Preferably the material used in the method being described here should be viscous or allowing being rendered as such for instance by adding solvents or applying an external factor such as pressure and/or heat. Advantageously the polarized substance can be transferred from a fixed transfer sheet or a roller to the substrate. Determination of the zones to be coated is carried out similarly to the lithographic generation of structures on a monolithically integrated circuit. Illustratively artwork prepared preferably in known lithographic manner from photoresist and by a commonplace procedure of exposure and etching provides apertures at dedicated sites into which the filter material is pressed and where it will adhere. In this procedure the filter material orientation remains unchanged. The filter material so transferred shall be hardened, that is it shall be made permanent, by special treatment. Since the said material also rests on photoresist-covered zones, chemical or mechanical cleansing may be carried out subsequently, whereby the coated surface is removed and polished until a planar configuration is attained comprising zones protected with photoresist and coated with filter material. In any further processing, the remaining photoresist may be removed entirely or in part to bare the areas underneath.

The problem discussed above is solved in a third disclosure by apparatus measuring the polarization of light comprising at least one sensor element, wherein grating structures made by lithographic procedures and situated in at least one manufacturing plane and/or wiring plane are configured above the sensor element, the geometry and orientation of said grating structures having been predetermined by planned mask data, in a manner that a polarization sensor is constituted as one unit, preferably the conventional structural sizes of planned integrated circuit manufacture being employed, wherein at least one sensor element is configured and cooperates with a polarization filter to constitute a polarization sensor as one unit of which the plane of polarization is oriented at a predetermined angle to a fixed reference axis of said sensor element, the reference axis being visible in the form of mark on the housing of the apparatus. This configuration can be attained in the simplest case by bonding a polarization sheet on a sensor element, for instance a photodiode, or by using methods disclosed herein, or further alternatives. The construction unit of a polarization sensor together offering the known, accurate orientation of the plane of polarization is the basis for using polarization in a plurality of applications such as, for example, in equipment to view a stereoscopic image and projectors to reproduce stereoscopic images. The required knowledge of the filter direction and the accurate alignment between sensor and filter jointly assure that said unit substantially facilitates applicability, and on account of the mark on the sensor housing, no special optical tools are needed.

Said above discussed problem is solved also by a fourth disclosure of the present invention by means of apparatus measuring light polarization, comprising at least one sensor element which is fitted with lithographically made grating structures, being configured above the sensor element in at least one fabrication plane and/or wiring plane, of which the geometric structure and orientation was determined beforehand by mask data design in a manner that a polarization sensor is constituted as one physical unit, where preferably only the conventional structure sizes of integrated circuit designs, and its conventional fabrication steps, are used. The use of conventional steps in manufacturing integrated circuits, as well being restricted to them, lead to the possibility manufacturing integrated circuits with polarization sensitive optic sensors absent any additional effort. Production and alignment of the filter relative to the sensor takes place with the same high accuracy as for the remainder of the integrated circuit. The structure of the polarization filter is defined by mask data which also control the remaining manufacture. The assumption here is, essentially, that the smallest structures can be made be smaller than the wavelength to be polarized. The grating period with parallel strips should be significantly smaller than half the wavelength. The filters in the form of grating structures can be produced lithographically in at least one fabrication plane and/or wiring plane of which the geometric structure and orientation was predetermined during the drafting of mask data, preferably only the structure sizes allowed when planning the integrated circuits being allowed (the so-called design rules). As regards present-day commonplace structural sizes of 130 nm or less, significant polarization can be attained in the IR range of light. If a contrast ratio of 1:3 can be attained in a 130 nm technology with a single layer filter, for instance at a wavelength of 1.5 microns ($\mu$), then, to a first approximation, the contrast is raised to a higher power when several filter layers are arrayed in series in accordance with the concatenation of the transfer functions. When making optimal use of all finely structurable polycrystalline silicone and metallization planes, high contrast ratios can be attained in standard technologies without entailing even one additional processing step. Using this method, and besides saving the expense of separately manufacturing a filter sheet, it is possible to substantially raise the number of sensors per area as a result of which more information is available in the same or less space. In the case of a specially selected geometry of the stacked filter planes or at specified wavelengths, resonance effects may be advantageously exploited to further increase contrast.

A fifth disclosure of the present invention allows solving the above cited problem by means of apparatus where, to generate polarized light, at least one light source cooperating with a polarization filter forms a construction unit of polarized light emission, its plane of polarization subtending a predetermined angle with a predetermined reference axis by means of a marking on the apparatus' housing. Such a construction unit offers similar advantages as those offered by an apparatus comprising at least one sensor element, wherein it is configured as a unit of a polarization filter cooperating with a polarization sensor, said sensor's plane of polarization being aligned at a predetermined angle relative to a fixed reference axis of the sensor element, the reference axis being visible by a marking on the apparatus housing, namely obviating the need for special optical implements to generate accurately directed polarized light.

In a sixth disclosure of the present invention, the previously discussed problem may be solved by an apparatus that comprises at least several light sources, which are used to generate polarized light signals, in particular image signals, preferably at least three light source being used which are fitted periodically with a polarizing filter of different, predetermined orientation, the polarizing filters of different orientations preferably being situated in one plane. Such features can be implemented by the manufacturing methods disclosed herein. A periodic configuration of polarizing light sources of which the planes of polarization correspond to that of a complementary polarization sensitive image sensor is advantageous. In that case an image containing polarization data can be reproduced.

A seventh disclosure of the present invention to solve the previously discussed problem is solved by apparatus comprising a projector that preferably reproduces stereoscopic images, wherein one projector projects two half-images onto one projection surface which is fitted with a polarization filter of a spatially different direction of polarization, preferably two mutually orthogonal planes of polarization being used alternatingly.

Advantageous embodiment modes of the above described objects of the invention are elucidated in the specification below.

In an advantageous implementation of the method of the invention to manufacture a polarization filter, ferromagnetic materials are used in lithographic structuring.

Because of the permeability $\mu_r$, the skin depth $\sigma$ is reduced, as a result of which thinner layers may be used to absorb incident light. Thinner filters are advantageous when light is incident at a large angle to the normal.

In a further advantageous implementation of the method of the present invention, the conductor paths used for polarization are wired in comb-like manner. The intermediate dielectric is stressed by high voltage application and hence the index of refraction is affected. In this way the filter behavior can be controlled electrically.

In a further advantageous implementation of the method of the present invention, the conductor tracks used for polarization are so wired that a heating current may pass through them to affect the index of refraction. In this manner the filter behavior can be electrically controlled.

In an advantageous implementation of the method of the present invention to manufacture a polarization filter, nanowires of a diameter larger than the skin depth of the wavelength being filtered are imbedded in a dielectric when manufacturing the polarizing substance, preferably a ferromagnetic material such as iron being used for the nanowires.

In another advantageous implementation of the method of the present invention, the dielectric between the electrically conducting polarizing filter structures is a material of low index of refraction which is converted into a metamaterial of still lower dielectric constant to improve both the polarization properties at a given wavelength and the geometry of the polarizing structures, respectively to enlarge the required minimum structure sizes. In this respect the metamaterial in particular is a foamed or a porous substance. Appropriate initial materials are for instance glass ($SiO_2$, $\epsilon_r \approx 4$) or benzocyclobutene (BCB, $C_8H_6$, $\epsilon_r \approx 2.5$), the pores preferably being filled with air.

In another advantageous implementation of the methods of the present invention, parts of the polarization filter's dielectric are removed following manufacture by selective etching in order to produce extensive zones of minimal dielectric constant. The size of the cavities produced preferably is selected in a manner that the polarizing structures are supported on the remaining adjacent dielectric. Accordingly the etching is preferably carried out from beam-like and extensive trenches transversely to the orientation of the polarizing structures, where the width of the trenches may be larger than the wavelength of the light to be filtered. Preferably the cavities crossed by the polarizing structures are filled with air.

In a further advantageous implementation of the method of the present invention to manufacture polarizing filters wherein a polarized substance of predetermined direction of polarization is deposited on a lacquer-coated substrate and at a given angle to this substrate, being acted on by at least one physical and/or chemical factor such as pressure, temperature or the like, specific substrate zones being rid of the lacquer for instance by illumination or etching, and where, following hardening and/or cooling of the polarized substance on the substrate, the excess polarized material and/or lacquer of the still covered zones is further removed by etching and/or polishing, the said method is sequentially used with a different direction of the polarizing substance relative to the substrate on different zones of the substrate, where the pre-manufactured polarizing zones are protected preferably by a thin lacquer layer that can be removed at the end of manufacture. In this way accurately bounded zones of known and different orientations are produced, which are situated in the same plane and therefore may be a minimum distance from a light sensor or a light source. Compared to alternative procedures wherein the same effects are attained by means of several filter layers comprising deactivated zones, the present invention offers savings in weight and costs.

In a preferred implementing mode of the present invention to measure the polarization of light, at least one sensor element is provided above which are configured grating structures made lithographically in at least one fabrication plane and/or wiring plane of which the geometric structure and orientation were predetermined in mask data planning in a manner that a polarization sensor is constituted as a construction unit, preferably using only the structural sizes conventional when designing integrated circuits and the conventional manufacturing stages in making integrated circuits.

In an advantageous embodiment mode of the present invention of apparatus measuring the polarization of light, at least two polarization sensors are used, of which at least one is designed as disclosed herein, with a different orientation of the planes of polarization, means being provided to analyze the signals from the polarization sensors with respect to the polarization of the incident light. By forming for instance the ratio of every two sensor signals, said means can determine the plane of polarization of incident polarized light independently of its brightness. Planes of polarization differing by 45° or less are advantageous because then taking the ratio burdons linearization less, that is, it may take place without linearizing the Malus law non-linear sensor behavior.

In another advantageous embodiment of the present invention of apparatus measuring the polarization of light, a plurality of polarization sensors is configured and oriented in their particular directions of polarization in a manner that they are appropriate to receive an image with information about the incident light's polarization. For that purpose first a regular structure of photosensors is produced such as are conventional for image sensors. In a later stage of manufacture, polarization filters are deposited in a fixed periodic orientation on all sensor elements that must be made polarization sensitive. Illustratively a periodic cell with 2*2 cells and filters each rotated by 45° is advantageous. Such a sensor may be applicable in quality control where it may enhance streak photography and improve analysis of the intensity and kind of stresses.

At least one color filter is used in still another advantageous embodiment mode of the apparatus of the present invention measuring the polarization of light. This design is especially advantageous for a regular photosensor structure appropriate for receiving an image because further enhancing the image information. Besides a design of separate color and polarization sensitive photosensors, another design is possible, wherein both kinds of filters are used in combination for each photoelement. The most appropriate design is attained by selecting a filter system in a manner that the recorded signal does not differ from the signal of a conventional color image sensor when using exclusively unpolarized light. A commonplace image sensor layout is the Bayer layout wherein a color pixel is constituted by an array of 2*2 photoelements and comprises color filters for instance for red, green, green and blue. If four color pixels in the form of a 2*2 array are always combined into a superpixel, where advantageously each color pixel within the superpixel direction is offset by 45° from the alignment of the polarization filter relative to the adjacent color pixel, then, as regards unpolarized light, the behavior and the resolution of the sensor does not differ from those of a conventional color sensor, only the incident light flux being reduced by about one half. In the case of fully polarized light the effective resolution is reduced to 25% because each color pixel preferably records only light from the proper plane of polarization. A full summing of the data from all color pixels of each superpixel into a replacement pixel may take place in the ensuing image processing in order to result in the same image that would have been received by an image sensor insensitive to polarization. However, when properly weighting such summing, a decision can be made for each superpixel how strongly and in what direction polarized light should be displayed or suppressed. If a photographed scene comprises one or more specular reflections of which the light is polarized in different directions, then a photographer is able—in the state of the art—only to remove one such reflection by means of a polarization filter configured rotatably in front of the photographic lens. An image already taken with a conventional camera cannot be processed any further because such an image would entirely lack information about the polarization status. Using the apparatus of the present invention, the photographer may post-facto remove in controlled manner both reflections, though he also may optionally reinforce them in controlled manner. In the described and advantageous embodiment mode of this apparatus, the above feature also can be applied in a color selective manner. Besides any artistic aspects, such a sensor also is suitable for surveillance cameras, for instance when monitoring traffic, to eliminate reflections. Because each individual photosensor contains individual, local information, a more skillful handling of sensor data than offered by summing into a replacement pixel is possible for the subsequent display, so that, in the ideal case, the image resolution is reduced only insignificantly locally in those zones of strong polarization and/or where it is manipulated.

In another advantageous embodiment mode of the apparatus of the present invention measuring the polarization of light, the angle of rotation between the polarizing light source and the polarization sensor is determined both by the polarizing light source and the polarization sensor. Using polarized light allows measuring angles in contactless and force-free manner without elaborate adjustments. In especially advantageous manner, the units of polarized light sources and polarization sensitive receivers are aligned at a predetermined angle relative to a fixed reference axis of the sensor element, the reference axis being visible by a marking on the apparatus housing, because special optic tools to adjust the filters are not needed.

A rotatable polarization filter is configured between at least one polarization sensor and at least one light source in a further advantageous embodiment mode of the apparatus of the present invention. The design of this apparatus is similar to a forked light barrier [slotted interruptor] with a slotted (optic) stop/aperture, in this instance the slotted stop being replaced by the polarization filter. Where small sizes are involved, slotted stops offer only low resolution because as the slits become smaller, adjustment becomes more elaborate and the probability of, and malfunction due to, soiling and dirt increases. Such problems do not arise when using polarization filters.

At least one polarization sensor, one light source, one rotatable polarization filter and one reflecting medium are mutually arrayed in a further advantageous embodiment mode of the apparatus of the present invention in a way that the light emitted from the light source can be reflected by the reflecting medium, then can pass through the rotatable polarization filter and be detected by at least one polarization sensor. In this embodiment the emitter and the sensor may be jointly configured in one plane and also be integrated into each other, offering greater compactness and less weight than a forked light barrier. The configuration of polarization filter and reflecting medium, for instance paper or a matte metal, allows angular measurement also in situations precluding light transmission measurements. Such a configuration can be mounted on a gear or even on a shaft. In this manner the apparatus' size and weight are much reduced, and the application also may be carried out at much higher angular speeds due to smaller centrifugal forces.

In another advantageous embodiment mode of the apparatus measuring the polarization of light of the present invention, the polarization sensor jointly with a device driving an actuator and comparing the test signal with a reference value are configured in cooperating manner, in particular being integrated into each other. In particular as regards apparatus wherein a light source, a rotatable polarization filter and a reflecting medium are mutually configured in a manner that light emitted by the light source can be reflected at the reflecting medium, can pass through the rotatable polarization filter and can be detected by at least one polarization sensor, servos can be manufactured at minimal manufacturing and adjustment costs while being very compact. If the angles are measured directly at the motor shaft of a servo motor, the size of the servo is practically reduced to the size of the motor. Step motors or ultrasonic motors are especially appropriate for small adjustment steps.

Means to electronically calibrate and/or store calibration data are used in a further advantageous embodiment mode of the apparatus of the present invention measuring the polarization of light. These data may increase the reliability and accuracy of the apparatus, in particular when less-than-ideal behavior must be taken into account. Besides Malus' law, such less-than-ideal behavior also includes incomplete filter polarization or leakage currents.

Automated calibration means are used in another advantageous embodiment mode of an apparatus measuring the polarization of light. In this manner calibration data may be determined and/or updated following first-time operation or during operation. If a servo reference default changes over a large enough angle, there is assurance that at least one polarization sensor temporarily shall deliver a minimum test value corresponding to various non-ideal behaviors. In this manner costly and elaborate adjustment may be avoided.

At least one polarization sensor, one transparent medium and one polarized light source are used in a further advantageous embodiment mode of the apparatus of the present invention, said polarized light after passing through the transparent medium—which preferably allows using the Faraday or the Kerr effect—being detected by the polarization sensor. Such apparatus is appropriate to measure strong static and dynamic magnetic or electric fields and merely requires that the transparent medium be defined as to its shape, but requiring no electrical or magnetic components in the field to be measured. This design offers various advantages relative to Hall generators or measuring coils, in particular in rapidly changing fields.

In one advantageous embodiment mode of the apparatus of the invention generating polarized light, means are provided to view a stereoscopic image and/or two independent images, said means showing only a portion of the displayed image to different observers and/or to the eyes of an observer by means of preferably rotatable polarization filter. Illustratively spectacles with two rotatable polarization filters may be used to only convey information regarding the true direction of polarization to one eye. In this manner the two eyes of an observer may view a scene that was shot from different perspectives, leading to spatial perception. Also different information may be displayed that were perceived separately. Again various observers may perceive different information when looking on the same apparatus.

SPECIFIC DESCRIPTION OF ILLUSTRATIVE
EMBODIMENT MODES OF THE INVENTION

Example 1

Figure 1B:
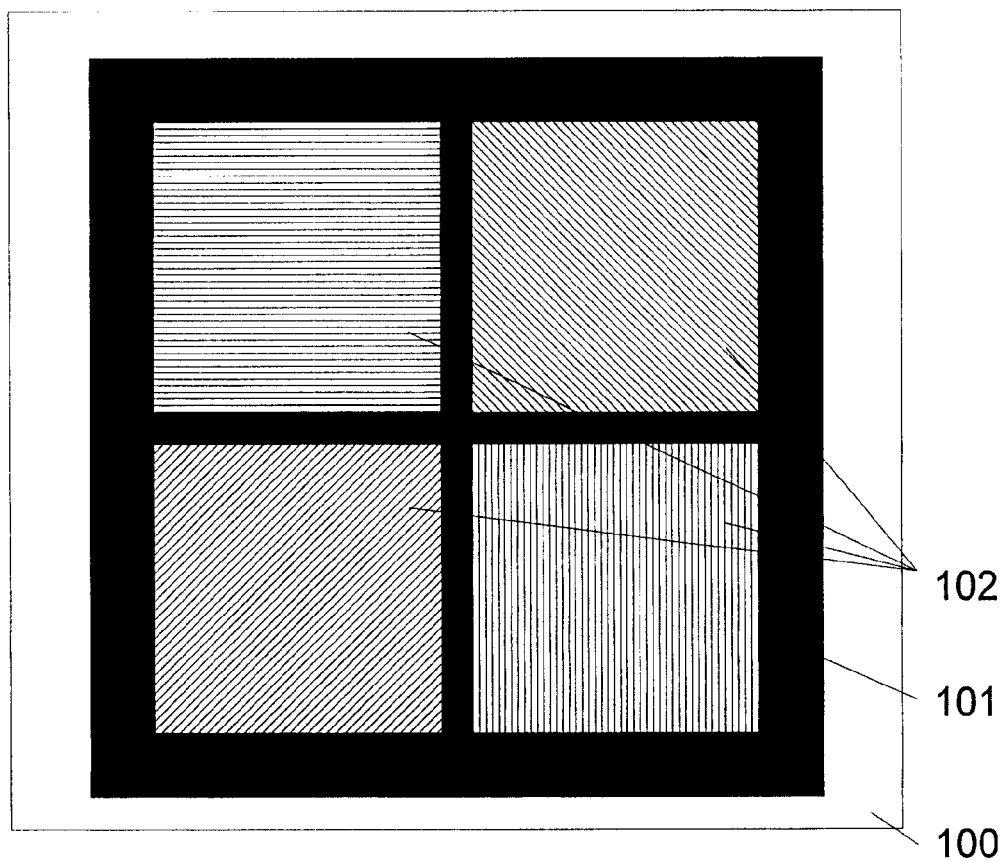
FIG. 1b shows an illustrative structuring of a manufacturing plane exhibiting an optically polarizing effect of the present invention, in top view.
Figure 1C:
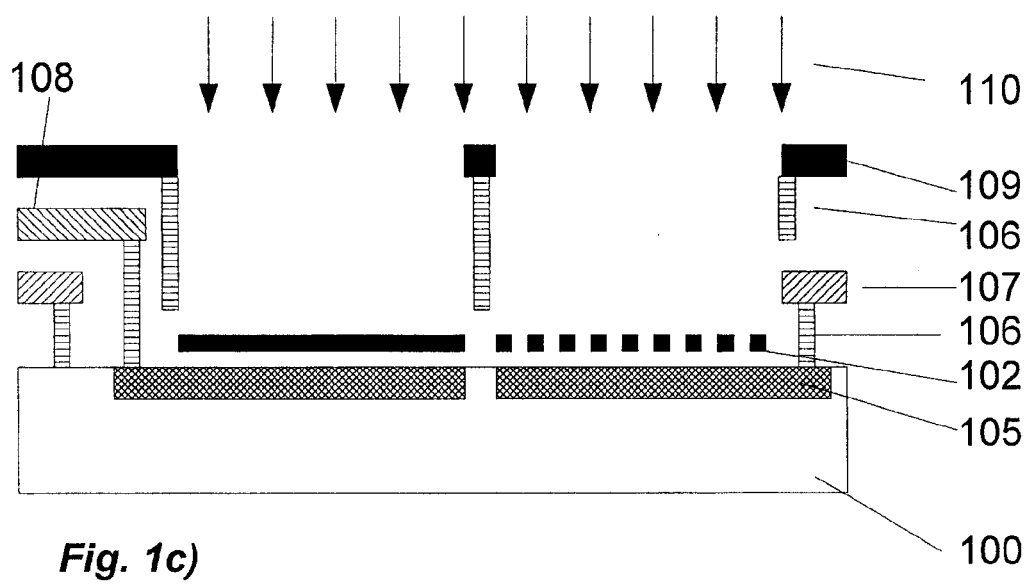
FIG. 1c shows an illustrative structuring of a manufacturing plane having an optically polarizing effect, of the present invention, in cross-section.

Manufacture, Restricted to the Manufacturing Steps for Making an Integrated Circuit, of Structured Polarization Filters Using Photolithography Whereas the manufacture of nanostructures of controlled orientation is fairly problematical, such a problem has long been solved in microelectronics. The structures are drawn by the CAD system, they are replicated, usually on an enlarged scale, on an exposure mask, and are photolithographically transferred from the exposure mask to a substrate respectively a wafer (FIG. 1a). As a rule first the wafer 1 is coated with a photoresist 3, then it is exposed through the exposure mask 4 whereby specific portions will respond to a subsequent chemical process, that is, they might be etched free by a solution 6. Another etching procedure may then be carried out using an etching solution 7 to structure a previously prepared full surface metal plating 2, or diffusing or implanting procedures are carried out. The remaining lacquer structures 3 in such instances protect given zones against processing. For a long time the minimum structure sizes that could be manufactured economically in micro-electronics were not small enough relative the wavelength of light to produce optically effective filters. This state of affairs has changed most recently. Conventional 130 nm or smaller manufacturing technologies allow making polarization filters without changing the manufacturing procedure. For that purpose parallel conducting tracks are produced on the polysilicon or the metal planes above the photosensor. As regards contrast enhancement, it is advantageous to use several superposed manufacturing planes, for instance a layer sequence of poly, metal 1, metal 2 . . . through metal N. Because modern (manufacturing) processes comprise more than 2 poly planes and 8 metallization planes, up to 10 filters may be configured in series. Even if the contrast ratio of a single filter at a given wavelength may only be 3, the contrast ratio of 4 sequential filters ideally already is $3^4$=81. However it makes economic sense at this time to predominantly use the commonplace infrared wavelengths of 950 nm and 1.5μ because each reduction in size of the minimum structure entails costlier exposure masks and exposure techniques. Such a use is significant therefore when useful optical filters may be made by conventional manufacturing techniques. Said applications aimed at the mass market justify manufacturing using technologies in the 0.13μ range or below because the higher costs of masks may be overcompensated by the lower parts costs due to the smaller chip surface. The drawback of applicability restricted to long-wavelength light is compensated by the advantage that a filter so made is free of the chemical and thermal stability problems that befall conventional polarization filter sheets. As a result the limits on operation have been broadened, both at very low and very high temperatures. FIG. 1a schematically shows the sequence of the manufacturing steps for a single layer filter of the state of the art that may also be used unaltered to structure a polarization filter. Technical manufacturing details are not significant in this respect and as a result positive and negative procedures may be employed, x-rays may be used for exposure instead of light, electron beam lithography or ion beam lithography may be used, which depending on circumstance may be carried out entirely without a photomask and will write the structures by a directed beam into the lacquer. The reason that photolithography is preferred herein is solely because it is commonplace and economical. FIG. 1b shows an illustratively single layer sensor layout in top view (simplified and not to scale). In this instance the sensor 100 is characterized by preferably metal plated zones 101 that may cover a processing electronics, and sensor zones 102 each containing specific structures polarizing light. The shadings of the zones 102 denote the orientations of the manufactured structures. FIG. 1c shows the simplified, associated cross-section, pn diodes 105 as the photosensors being sketched in. In addition to the covering 109, opaque walls 106 are sketched in, illustratively made of vias (feedthroughs) respectively contacts/terminals and shield affecting adjacent sensors when the incident light is oblique. The wiring planes 107 and 108 in this instance are used to contact the pn diodes 105 whereas the polarization filters are made on a poly silicon layer 102 which ordinarily constitutes the gate of MOS transistors. Be it borne in mind that there are dielectric and metallic, optic filters that differ in their operation. The treatment of the poly silicon layers allows using both methods. What is significant for the method of the invention is merely that the data used in manufacture describe an optical filter for instance long, parallel strips as narrow as possible and as close to each other as possible, to produce a linear polarization filter or other optical filters.

Figure 1D:
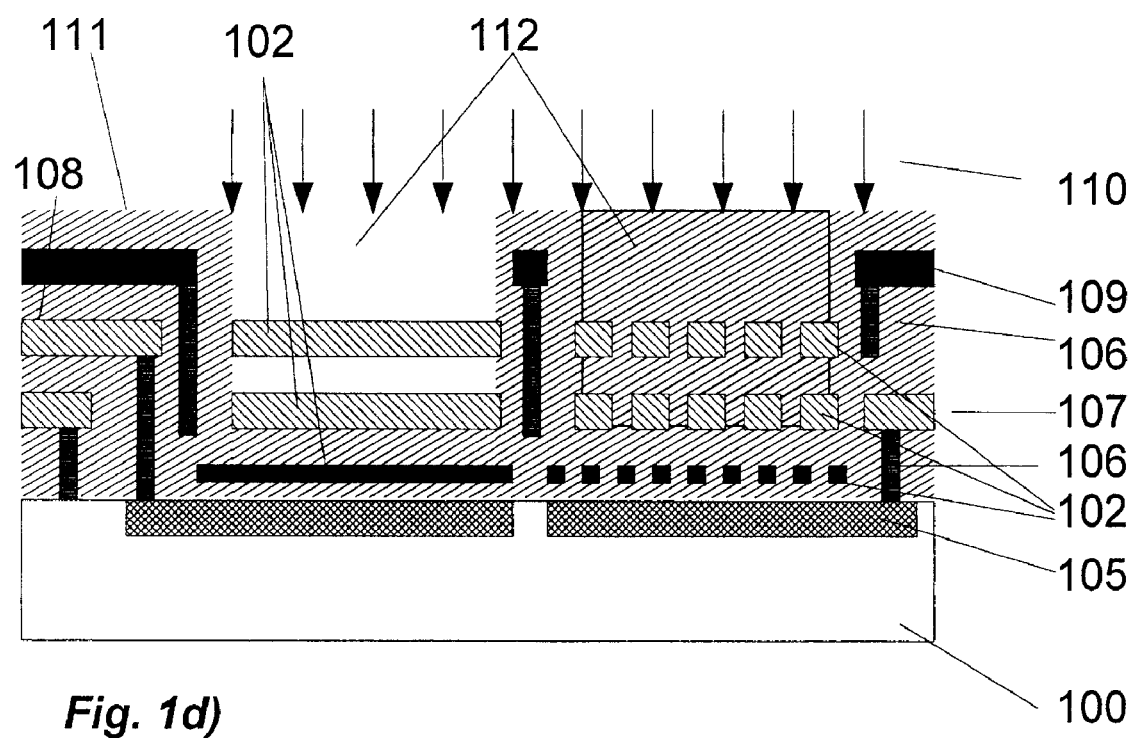
FIG. 1d shows an illustrative implementation of a polarization filter with cavities.

The polarizing properties may be significantly improved when substantially reducing the dielectric constant. The best dielectric accordingly is air ($\epsilon_r$=1). A typical manufacturing procedure for integrated circuits includes a mask for passivating apertures whereby covering oxide above the bond pads is removed. Because of the passivation thickness and the high tolerances in the upper layers, the feasible etching depth usually is very large and, where no metal impedes the procedure, reaches as far down as into the middle or lower wiring planes. This property is also exploited to constitute a reference rupture site at the outer edge of an IC. FIG. 1d is a cross-section of such a filter with four superposed filter planes 102. In particular the central wiring planes which ordinarily cannot be structured as finely as the lowermost one, profit by the dielectric's removal. If the dielectric 111 is glass, then the limit polarization wavelength is reduced by a factor of 2. By using conventional passivation etching to produce the cavities 112, again additional manufacturing costs shall be avoided.

Example 2

Manufacturing Structured Polarization Filters by Photolithography when Using Additional Manufacturing Steps Comparable to Those of Integrated Circuit Manufacture.

Figure 2A:
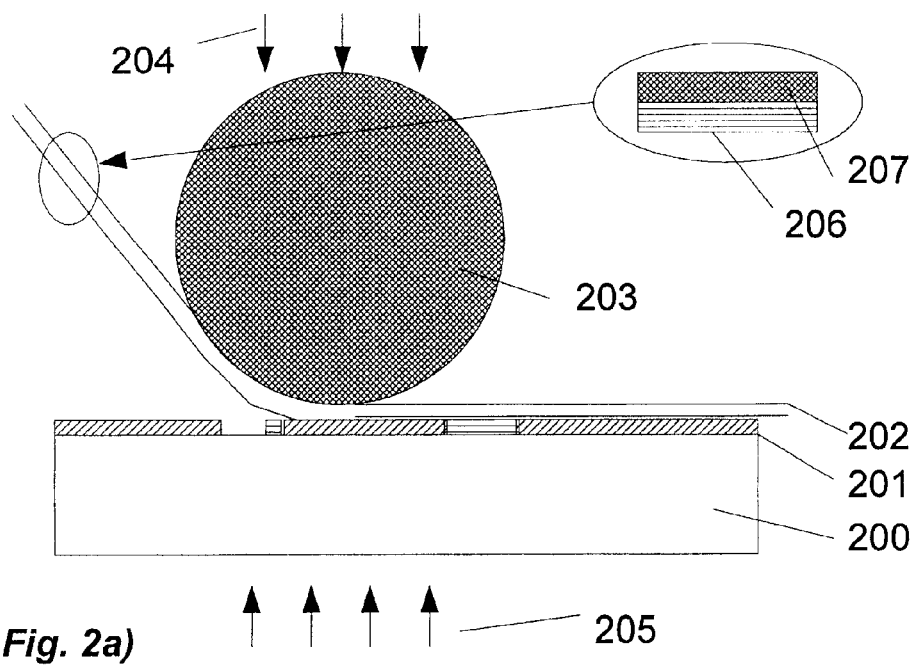
FIG. 2a shows an illustrative transfer of a polarization filter sheet to a substrate according to the present invention.

To make it possible to use a polarizing filter with short wavelengths light, that is in the visible range, implementation by other means than those discussed in example 1 is more economical. Because the large scale manufacture of polarization filters having appropriate properties is controlled, a combination of such sheets with lithographic methods may be employed to produce microstructured polarization filters. The most diverse manufacturing methods may be employed for the required polarization filters. Resin-imbedded nanotubes or nanowires also are applicable besides the conventional polymers. Such filters would be manufactured using comparable procedures with which large-area filters for instance are produced for LCD's. In other words, long-chain molecules, nanotubes or nanowires are oriented by an external force, for instance electric or magnetic fields, or by rubbing or stretching, into the direction of the applied force, as a result of which the orientation is known. In order that said molecules respectively tubes or rods retain their orientation, they may be imbedded into a substrate material imparting stability to them. When such a hardening substance with polarizing effects 206 is deposited on a roller 203 or a substrate sheet 207, then, at a later time, this substance can be transferred by means of a further external force such as pressure 204 and/or temperature 205 on a substrate, wafer or sensor 200 (FIG. 2a). Photolithography allows selectively clearing individual sensor areas for coating.

Basically there are two basic alternatives to lithographically structuring the polarization filters:

The first alternative is comparable to structuring a metallization plane for an integrated circuit, the methodology therefore corresponding to that of FIG. 1a, to the extent that the aluminum respectively the copper layer 2 is replaced by polarization filter layer. Following the prior full-surface coating of the substrate with the polarizing substance, this substance shall be subsequently etched away. In order to deposit, in the following steps, filters of different directions of polarization, one would preferably fill the zones that where previously etched free, with a non-polarizing substance and then make the surface plane in order to attain a proper substrate for the ensuing coating procedures of the differently oriented polarizing substance. In this case a sequence of layers is created of which the thickness is a multiple of a single layer. filter zones of a different orientation being at a different distance from the substrate respectively the sensor, a feature that may be a drawback. Also the maximum light passage through the filler substance is reduced.

Figure 2B:
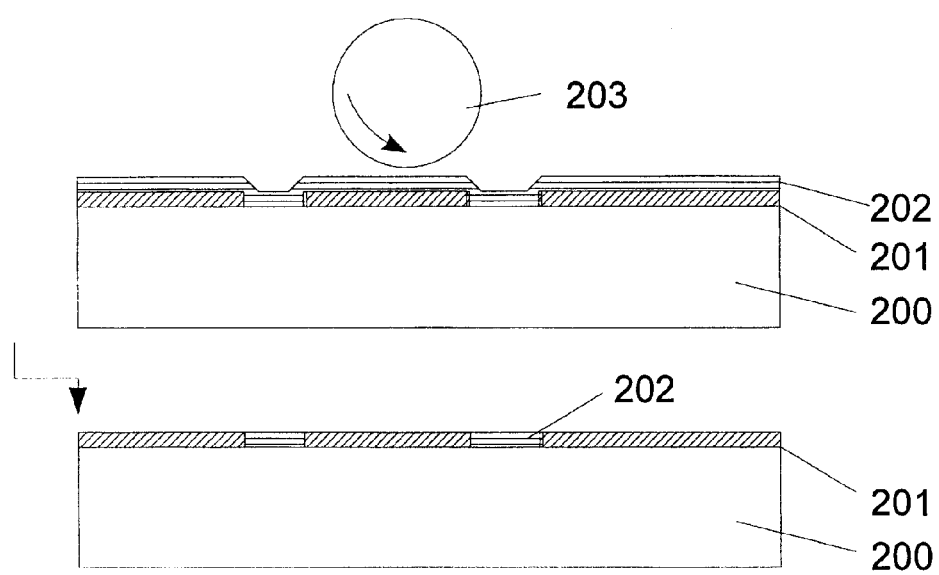
FIGS. 2b, 2c show process steps to transfer respectively microstructure a polarization filter on a substrate of the present invention.
Figure 2C:
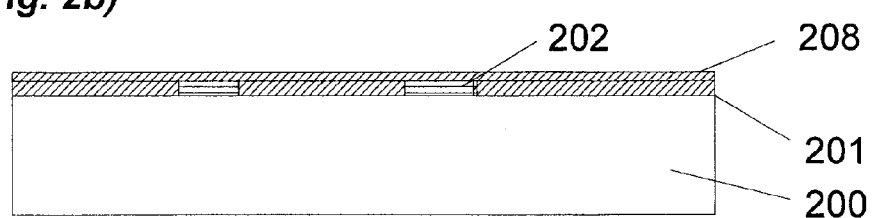

A reverse procedure also may be used. Therein, first a matrix with apertures is made with the lithographic lacquer 201, next the filter substance 206 is forced into said apertures. Following hardening of the substance, the excess material may be polished off (CMP) and/or be etched away (FIG. 2b). The material is shown symbolically being abraded by the grinder 203. In this process direct contact between the grinder 203 and the material 202 and 201 to be abraded is not mandatory, a force transmitting and optionally an etching liquid can also be advantageously used. Thereupon the substrates respectively sensors so prepared may be protected by a thin covering layer 208 (FIG. 2c). Following repeated etching off the remaining zones protected by lacquer and repeating the coating procedure at different angles, a filter array is gradually made and fitted with selective polarization filters of different directions corresponding to FIG. 1b. At the completion of these procedural steps, the surface may be fitted with a permanent protective layer. This method slightly deviates from IC manufacture but offers specific advantages when several filters with deviating orientation must be made because all filter zones are configured in the same plane and the end result is only as thick as a single filter plane. No fillers being needed, the light attenuation that would be entailed by them is also eliminated, and furthermore the weight is minimized. No contact being required in this procedure between the lithography mask and the filter material respectively substrate, the mask is free of mechanical wear. This feature is an advantage over micro or nano embossing techniques that otherwise also might be used to structure the polarization filters. Moreover the manufacture of embossing masks would not correspond to the method known from making integrated circuits and thereby would be less attractive economically.

Before or after manufacturing the polarization filters, the processing steps conventional for CCD or CMOS image sensors also may be carried out, for instance depositing color filters. Preferably microlenses are made after the filters are because otherwise they would fail to provide a flat support. These additional layers may be simultaneously used to protect the comparatively delicate polarization filters.

Manufacturing details are outside the scope of the present invention. Illustratively the coating processes are presumed being preferably carried out in vacuum to preclude air inclusion. Pretreating the surface of 200 may be required to improve the adhesion of the filter substance 206 on 200. Such decisions depend on the materials used and their nature.

Example 3

Polarization Sensors for Angle Measurement

A frequently encountered problem is measuring an angle at rotating parts, for instance to determine the position of a transducer (control stick, pedal etc.) or of a servo. As cited initially, commonplace measurement procedures incur restrictions for instance about resolution or adjustment tolerances as miniaturization increases and as the speed of measurement rises. Measuring angles by resorting to light's polarization may bypass many problems.

Conventionally a photosensor may be mounted for instance behind a rotatable polarization filter and be irradiated with polarized light of unknown polarization direction, and the signal measured at different angles of rotation and obeying Malus' law may be detected. When the signal is a maximum the orientation of the measuring polarization filter is identical with that of the incident light. Such a design is bulky and comparatively expensive. Also it presupposes that the signal being measured does not change during the measurement. Using several photosensors fitted with rigidly affixed polarization filters, for instance a bonded polarization filter sheet, is an alternative to the above design. The polarization filter alignment of each sensor illustratively may be in 90° steps or in 45° steps. It may be simpler still using identically polarizing sensors of known direction of polarization as a unit configured in a different orientation. A problem however arises in that the optically effective surface of the total sensor consisting of two or more individual sensors is larger than that of the individual, mechanically driven sensor. This means that the measured signal must be made available uniformly on the full sensor surface.

Simultaneous measurement of all detected polarization planes on the surface of a single sensor is made possible by integrating the individual sensors and the polarization filters into one integrated sensor assuming a structure similar to that of FIG. 1b. This integrated sensor entails no restriction on the rate of input signal changes.

Analysis of the individual sensor signals may advantageously also be integrated in the sensor, as a result of which the sensor output shall be in the form of easily processed test results. Both digital and analog signals may be used.

The problems of angle measurement are elucidated below.

Figure 4A:
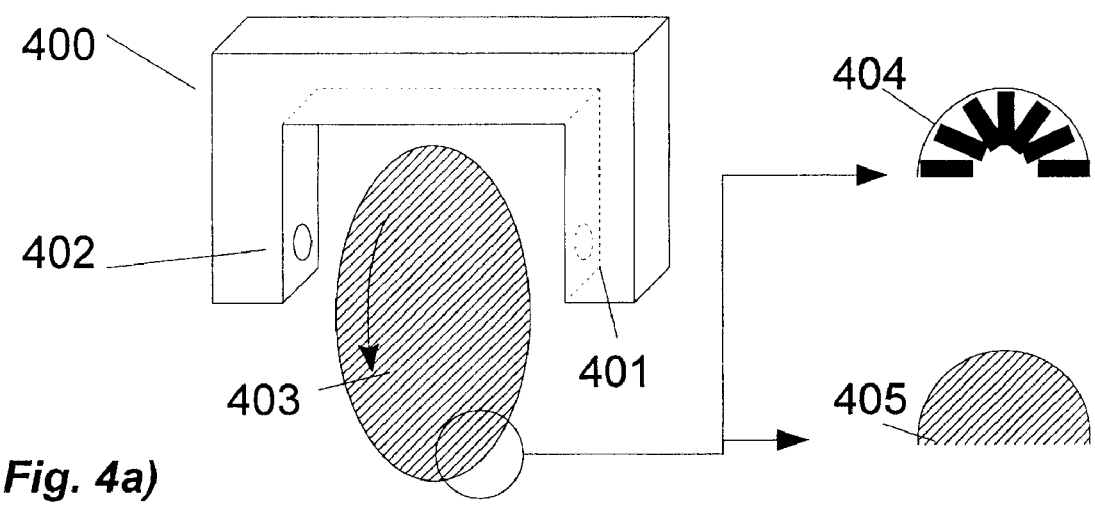
FIG. 4a is a forked light barrier with a slotted stop of the state of the art respectively with a polarization filter of the present invention.
Figure 4B:
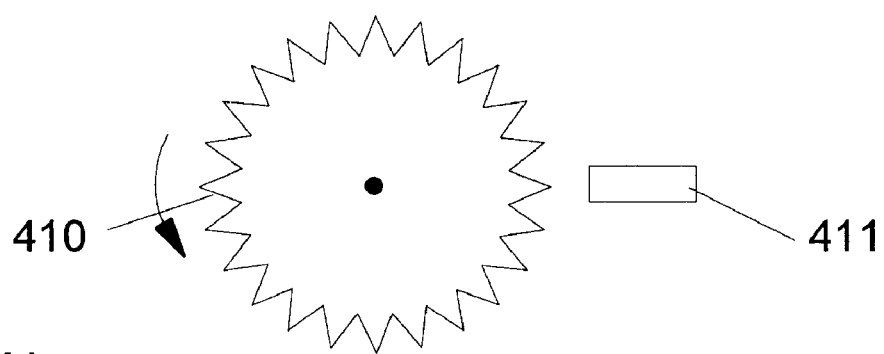
FIG. 4b shows the angle measurement of the state of the art with a gear.

In a first embodiment mode (FIG. 4a), the configuration of the invention is similar to angle measurement using a forked light barrier (also slotted interrupter, forked light switch) 400 and a slotted stop 404. A forked light barrier 400 comprises at one side a light source 402 such as a LED. A polarization sensor 401 is situated on the other side and preferably comprises four areas with polarization filters offset by 45°. However, instead of the slotted or coding stop, now a rotatably supported and unstructured polarization sheet 405 is configured between the transmitter 402 and the receiver 401. Because the polarization direction of the sheet is independent of location, accurate adjustment is not necessary, nor does soiling directly cause malfunction. Soiling merely reduces brightness and signal contrast.

The signal profile generated at the four sensors A, B, C, D when the polarization filter sheet rotates by 360° is shown in FIG. 6. The sensors A, B, C, D correspond to the areas 102 in FIG. 1b. The signal from each individual sensor obeys Malus' law. As regards metallic filters, at incidence of light with a polarization orientation in the direction of the filter strips, light ($\phi=0°$) is absorbed or reflected, the sensor signal I then being the minimum $I_{min}$. At a deviation angle of 90° the sensor is a maximum $I_{max}$. A less than ideal filter, or unpolarized scattered light, shifts the curves upward, thereby creating an offset. After the offset has been subtracted, the angle may be determined by taking the ratio of one adjacent sensor to the other, as a result of which the absolute brightness is not a factor. A uniquely defined position may be determined over a range of 180° by relating the individual sensors to each other. By combination with at least one bright/dark area in combination with at least one light barrier, the range of measurement is easily extended to 360°. Many other alternatives are conceivable in extending the measurement range to 360°. The polarization filter sheet may be structured further for that purpose, for instance by blackening certain zones.

In a further embodiment of the invention, the required filter surface may be reduced further, also the light source 702 and the sensor 703 may be configured in one plane, that is on a common support 704. This feature allows maximum compactness with all attendant advantages. As shown by FIG. 7, a scattering disk 701, for instance white paper or the matte surface of a gear, mounted behind the polarization sheet 700, allows reflecting light from the source 702 into different directions. This configuration allows arranging the transmitter and the receiver in a way that no reflections 705 from the polarization filter surface reach sensor 703, instead only signals passing through the surface of the filter 700. Reflections from the surface of the filter 700 would reduce the otherwise attainable contrast. It is insignificant whether the scattering disk 701 rotates jointly with the filter 700, independently from it, or does not rotate at all.

The embodiment of the angle sensor fitted with a reflecting polarization filter allows directly mounting the filter 700 on the motor shaft or gearing shaft. In this way minimal centrifugal masses can be attained. In especially advantageous manner, the servo electronics comparing the reference and actual values and driving an actuator can be jointly integrated into the sensor chip. Mounting the sensor unit above the measuring site, for instance the motor shaft, is carried out without specially needed adjustments. When using a micromotor, the sensor may for instance be received inside the gear unit. As regards stepping or ultrasonic motors, a gear unit may be dispensed with, in which case the entire servo is hardly larger than the motor itself. The extreme angle sensor miniaturization, optionally jointly with a servo electronics, down to a few mm³, contrary to what would be the case in the digital measuring procedure, does not entail resolution degradation while on the other hand allowing extremely high angular speeds. A monolithic integration of the transmitter 702 and receiver 703 also is conceivable.

In order to calibrate the sensor, on one hand the intensities of all sensor areas A, B, C, D may be summed to determine to total incident light flux, whereas an unpolarized auxiliary sensor may also be used. To measure the scattered light respectively the polarization factor, advantageously the minimum signal shall be detected and stored during the rotation. Calibration, besides being performed at the factory, also may be automatically carried out at first operation or later during maintenance cycles, sensor performance being unaffected by these cycles. Advantageously the determined values are stored in a non-volatile memory on the sensor (for instance EEPROM or Flash) so that they shall be immediately available upon renewed operation. Another advantageous design of the invention provides that the reference point of the sensor can be manipulated electronically and stored, because in this way costly mechanical calibration of the measured angle can be replaced by an electronic calibration.

Example 4

Measuring Strong Fields

A polarization sensor fitted with a filter system for instance as shown in FIG. 1b also can be used to measure strong magnetic fields using the Faraday effect, respectively strong electric fields using the Kerr effect, as shown in FIG. 8. If linearly polarized light 803 is made to pass through a medium 801 subjected to a strong field 804, then, the light's plane of rotation shall rotate depending on field and material. This rotation can now be detected in the angle sensor 802. Preferably the laser source 800 shall be a source of polarized laser light. It is especially advantageous in such a configuration that no electrically conducting or ferromagnetic objects be in the field, i.e. that the field shall be unaffected as much as possible. Because the system reaction is practically inertia-free, even very rapid transients—such as generated by impulsive discharges—can be detected. This feature is an advantage over many other measuring procedures, for instance induction coils or rotating vane electrometer. Using a miniaturized optic angle sensor 802 facilitates measuring small cross-sectional laser beams, thereby enabling also measuring spatially very limited fields.

Example 5

Recording Images Containing Polarization Information

Figure 9A:
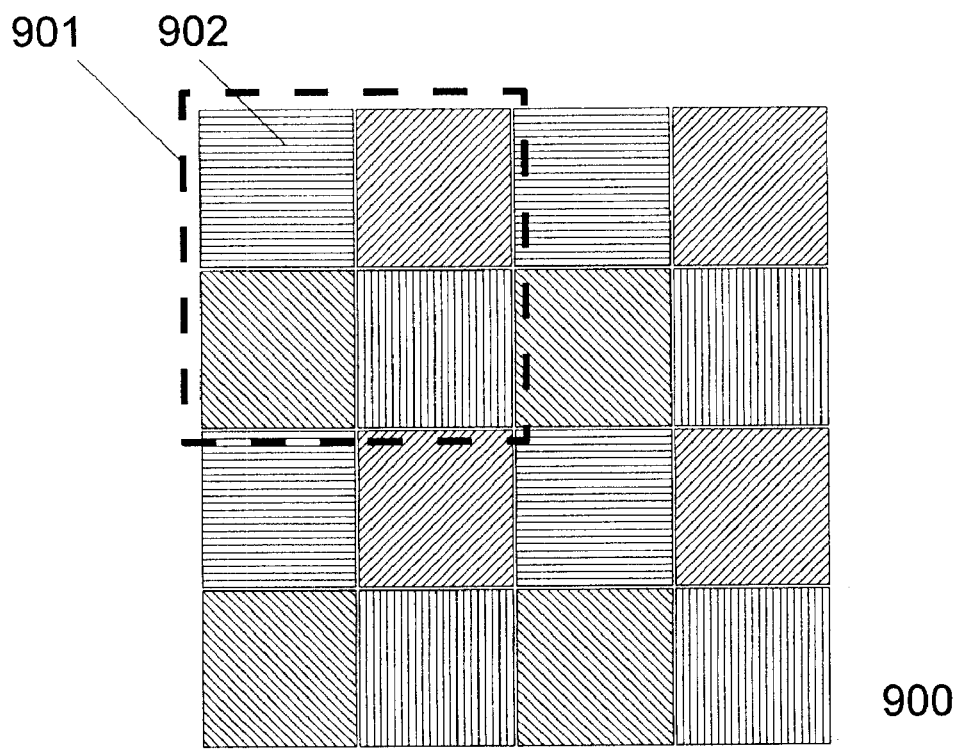
FIG. 9a shows an image sensor with a polarization filter of the present invention.

At higher integration, special configurations or regular arrays of polarization dependent photosensors also may be generated. Conceivably a counterpart to a color image sensor may be designed which, instead of the color filters (for instance a square GRBG matrix in the so-called Bayer format), comprises polarization filters in different directions, preferably in at least two orthogonal directions (0° and 90°) or better in four directions (0°, 45°, 90°, 135°)—FIG. 9a. The total sensor 900 then contains pixel groups 901 made up of photodetectors with individually oriented polarization filters 902. Streak photography using such a sensor might not only detect stresses but also offer better inferences about their intensity and kind. Using two orthogonal polarization filter orientations then allows determining the polarization orientation of polarized light, but cannot reliably discriminate between incident light of diagonal orientation and unpolarized light because in this case both filters transmit the same light flux. Using four different polarization filter orientations provides additional information about the degree of the incident light's polarization. Illustratively such information may be used to eliminate scattered light from the measured signal.

Figure 9B:
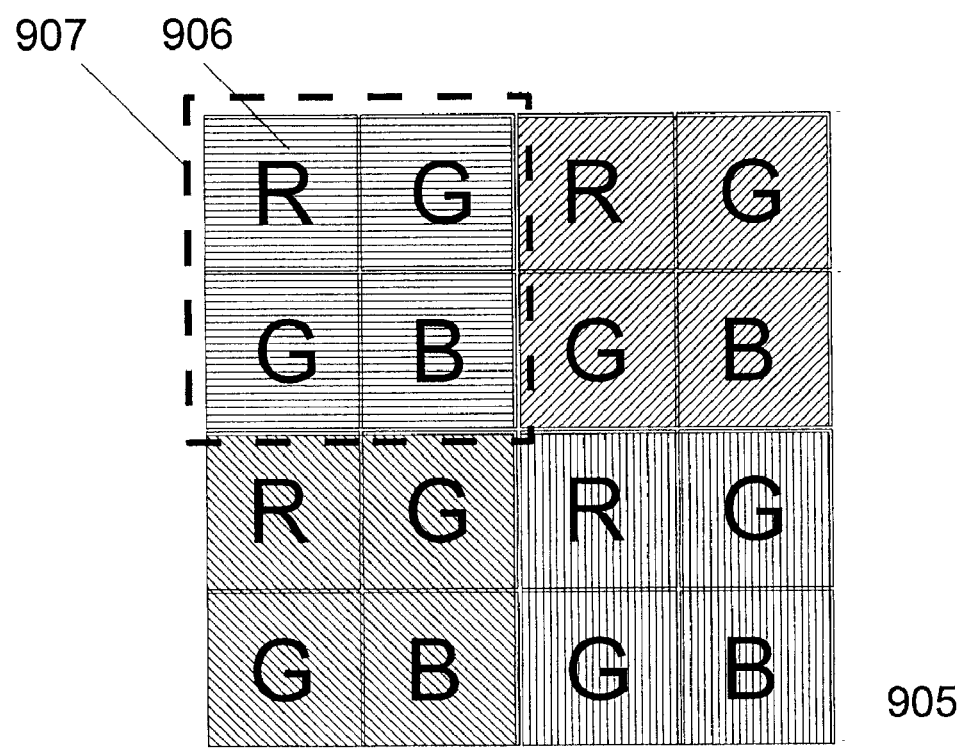
FIG. 9b shows a color image sensor with a polarization matrix of the present invention.

Considering conventional CCD or CMOS image sensors, the cost in making the image sensor and in analyzing the image recovered from it is small. This image can be immediately viewed on a conventional gray step monitor, though devoid of recognizable polarization information. The polarization information may be reproduced on a conventional color monitor as spurious color information. Versatile applications are available. An image from such a sensor may be manipulated by image processing as if recorded with a conventional image sensor fitted with a polarization filter in selectable orientation. Moreover reflections can be suppressed or reinforced in position-dependent, that is, in controlled and gradual manner. Automated recordings, for instance from traffic monitoring cameras, may be processed subsequently, also automatically, in a way that a person— even in the presence of undesirable reflections at a specular surface—can be recognized. A combination of polarization filter array and color filter array on an image sensor enables this operability also with color images. Maximum flexibility is attained when the color matrix remains unchanged compared to a conventional image sensor, that is, the polarization filters always are mounted on adjacent color pixel cells. FIG. 9b shows this state for a sensor in the common Bayer format. The sensor 905 in this case is fitted with color sensitive photosensors 906, one polarization filter being associated with each complete color pixel, the polarization of said polarization filter changing periodically. In the Bayer format, the green sensitive sensor is present dually in order to be able to measure especially well the brightness information in the range wherein the human eye is especially sensitive. Accordingly another configuration is also conceivable, wherein one of the two green sensitive sensors is devoid of a polarization filter and therefore evinces higher, general sensitivity to light. Many other variations are conceivable. Basically the manufacturing sequence of the different filters (polarization filters respectively color filters) is irrelevant. In the case of unpolarized light, such a sensor's image does not differ from the image of a conventional color sensor. In particular, in the case of unpolarized light, no reduction in image resolution takes place. As regards fully polarized, incident light however, part of the spatial resolution is lost because no light is incident on the sensor underneath the filter. A worst, in the case of two orthogonal filters, the loss in resolution will be 50%, and in using four filter orientations, at worst it will be 25%. Compared to a conventional image sensor not responding to polarization, the reduction in sensitivity to light due to blocking out the particular unsuitable direction of polarization is a factor of about 2.

Example 6

Reproducing Signals or Images Containing Polarization Information

As elucidated in Example 4, light sources of polarized light may be significant for certain applications. As regards angle measurement too, instead of an unpolarized light source with a rotating polarization filter, the angle between a polarized light source and the sensor may also be measured. In this manner an angle may be measured over a large distance. The light source/polarization filter unit is appropriate for such applications.

Moreover luminescent arrays or monitors may be fitted with polarization arrays to faithfully reproduce an image that was recorded with a polarization sensitive camera. Appropriately the monitor and the camera have a similar filter structure, at least the same angular resolution. In such a case no special intermediate stage is required for signal processing. The generation of stereoscopic images opens a wider scope of applications. A frequent viewing of stereoscopic images makes use of color spectacles, for instance with a red filter for the left eye and a green filter for the right eye. A monitor radiates monochrome views of a scene from two perspectives in the corresponding colors. In this procedure, the left eye views images in a first color and the right eye views images in a second color. The brain combines these images into one overall spatial view. This procedure offers the advantage of operating successfully with every monitor and being independent of position and direction of viewing. It does however incur the drawback that the color reproduction is defective. The problem of color reproduction can be solved by so-called shutter spectacles. The monitor alternatingly shows two color pictures. The shutter spectacles (LCD with one element per eye) in synchronization with the monitor darkening each time one eye.

The drawback of the above means is the cost of the spectacles and in particular the need for a power supply and for accurate synchronization. Also the effective image repetition rate drops to one half. Too, as regards motion pictures, such offset display is stressful to the viewer, too.

Another design uses specially manufactured monitors with microprisms or microlenses are configured at regular intervals on the monitor. Said microprisms or microlenses cause light from even numbered respectively odd numbered columns to be deflected into the left respectively the right eye. While spectacles are needed for viewing, on the other hand the observer accesses only a narrow field of view—this system is inoperative when viewed laterally. While the image repetition rate of this method remains constant, the image resolution drops to one half.

An alternative design for stereoscopic displays is made possible by the manufacturing methods proposed herein by the present invention in that the generated light is polarized alternatingly at a 90° rotated direction, that is vertically and horizontally. This feature can be in rows or columns. In a further mode of implementation, a mosaic configuration is used, because the eye in this design no longer is as readily aware of the structure of the image generation (see image quality of hole and strip mask). Spectacles are required for observation, each half of these spectacles being fitted with a polarization filter with the correct alignment for the particular half image. Neither a power supply for the spectacles nor synchronization with the monitor is required. Also the observer is free to move within the room. Only when the head is slanting strongly to the side are display defects noticeable. The image repetition frequency of this method remains constant, the resolution is halved when using two orthogonal polarization orientations. When the spectacles are removed, a 2D image may be seen on the monitor at the original resolution—the human eye does not perceive the different polarization.

The application is not restricted to tube or LED monitors which basically generate unpolarized light. Even LCD's which inherently are fitted with polarization filters may be fitted with additional polarization filters at mutually orthogonal orientations when the individual selective filters are rotated by +45° respectively −45° relative to the entire filter.

Because the separation of the left and right images is almost ideal, just as in the shutter spectacles, further and exotic applications are available. The two half images are not mandatorily part of one stereoscopic display of the same object—they may be entirely independent. For instance one half image may render a movie whereas the other half shows a news report text. The observer therefore is able to perceive simultaneously two different scenes and concentrate on one, and still react immediately to sudden events in the other. This feature is like image-next-to-image instead of the known image-in-an image display.

If the polarization filter spectacles are fitted with stepwise rotatable filters, further significant possibilities are available. Besides stereoscopic display (and inverse stereoscopic display) it is possible now to follow either scene 1 or scene 2 with both eyes. In this manner a scene might be represented in two entirely different perspectives and each observer is free to decide which perspective is more appropriate. A TV set with several receivers or a monitor—preferably when headsets are used—may simultaneously reproduce two completely different films. Many opportunities rise for leisure time, for computers and in the medical arts.

If in the manner or similarly to the camera of Example 5 the monitor is fitted with four filters, displaying a stereoscopic signal does not entail loss of 50% of resolution/image brightness provided the particular pixels polarized diagonally to the spectacles reproduce mixed information from the properly oriented pixels. However such an embodiment requires special processing of the stereoscopic half images before displaying them.

A similar application to projectors also is possible. In this case the polarization filters are not mandatorily configured between the light source and the observer, instead the light may be projected through an array of polarization filters with alternating orientations of the plane of polarization onto a screen. Following reflection, the light again passes through the same filter element and arrives at the observer wearing spectacles fitted with appropriately oriented polarization filters. The projector, respectively the image resolution, in this instance must match the projection screen in order that individual pixels belonging to a given half image be incident on said projection screen's matching zones. Contrary to integrating the array of polarization filters into the projector, the filter in front of the projection screen allows greater brightness without incurring heating due to absorbed light.

Example 7

Projecting Stereoscopic Images

The image generator/polarization filters unit is unsuited for image projection onto a large area because the polarization filter is heated by the absorption of inappropriate, polarized light. Desirably therefore the area of the polarization filter should be enlarged. The filter may assume its maximum size immediately in front of the projection surface (screen).

In such a case, moreover, it is immaterial whether the projection surface (screen) preserves the light's plane of polarization because the reflected light on its way to the observer again passes through the filter. This configuration is shown in FIG. 10, A projector 1002 projects an image on the matte screen 1000, the light before reaching this screen passing through a polarization filter matrix 1001. Preferably the polarization filter matrix comprises filter zones which are mutually orthogonally polarized, each of these zones in a sense corresponding to one image point. The projector is required to project all image data belonging to a given stereoscopic half image through a matched polarized zone of the polarization filter. The observer 1003 looking through spectacles fitted with appropriate filters 1004 at the projection surface (screen) 1000, he/she shall perceive a spatial image, the observer's position relative to the projection screen being practically immaterial. However the projector and the projection screen must be matched to each other as regards resolution. Advantageously therefore a digital projector may be used to generate both half images, said projector's image being defined in terms of pixels, the projection screen comprising a matching, polarized zone for each pixel. When using analog projectors, it is appropriate to use two hole stops that transmit the signal from a given projector onto to the associated zones of the projection surface (screen) and that reflect or absorb components that otherwise would be projected onto the wrong zones.

The invention claimed is:

1. A method for manufacturing an apparatus with a polarization sensitive filter of given size and orientation, wherein parallel, thin, elongated grating structures close to one another are produced using lithographic methods, thinner than the wavelength to be measured and with a spacing smaller than the wavelength to be measured, using a plurality of manufacturing planes or metallization planes, having defined the geometric structure and orientation already during the design of mask data, restricting to the feature sizes and manufacturing steps allowed for the design of integrated circuits, wherein the polarization sensitive filter includes at least one sensor element that is adapted to cooperate with a polarization sensor of which the plane of polarization is aligned at a predetermined angle relative to a fixed reference axis of the sensor element, and wherein the fixed reference axis is noticeable by a marking on a housing containing the polarization sensitive filter.

2. The method for manufacturing a polarization sensitive filter according to claim 1, wherein ferromagnetic materials are used in lithographic structuring.

3. The method for manufacturing a polarization sensitive filter according to claim 1, wherein the electric conductor paths used for polarization are wired in comb-like manner.

4. The method for manufacturing a polarization sensitive filter according to claim 1, wherein the electric conductor paths used for polarization are wired in a manner that they may carry a heating current.

5. A method for manufacturing an apparatus with a polarization-sensitive filter of given size and orientation, wherein a polarized substance of predetermined direction of polarization is deposited on a lacquer-coated substrate at a given angle to this substrate, being acted on by at least one of a physical and chemical factor, specific substrate zones being rid of the lacquer by illumination and etching, and where, following at least one of hardening and cooling of the polarized substance on the substrate, at least one of the excess polarized material and lacquer of the remaining covered zones is further removed by at least one of etching and polishing, wherein the polarization sensitive filter includes at least one sensor element that is adapted to cooperate with a polarization sensor of which the plane of polarization is aligned at a predetermined angle relative to a fixed reference axis of the sensor element, and wherein the fixed reference axis is noticeable by a marking on a housing containing the polarization sensitive filter.

6. The method for manufacturing a polarization sensitive filter according to claim 5, wherein the method is sequentially applied to different substrate zones with a different alignment of the polarized substance relative to the substrate.

7. The method for manufacturing a polarization sensitive filter according to claim 6, wherein the prefabricated polarized zones are protected.

8. The method for manufacturing a polarization sensitive filter according to claim 7, wherein the pre-fabricated polarizing zones are protected by a thin coat of lacquer that is removed at the completion of manufacture.

9. The method for manufacturing a polarization sensitive filter according to claim 5, wherein nanowires of a diameter larger than the skin depth at the wavelength to be filtered are imbedded in a dielectric in order to manufacture the polarizing substance.

10. The method for manufacturing a polarization sensitive filter according to claim 9, wherein the nanowires are made of a ferromagnetic material.

11. The method for manufacturing a polarization sensitive filter according to claim 5, wherein a material with a low index of refraction is used as the dielectric between the electrically conductive filter structures, said material being transformed into a metamaterial with a yet lower dielectric constant.

12. The method for manufacturing a polarization sensitive filter according to claim 5, wherein parts of the dielectric of the polarization filter following manufacture are removed by selective etching.

13. An apparatus measuring the polarization of light and comprising at least one sensor element, wherein the sensor element is configured as a unit of a polarization filter cooperating with a polarization sensor of which the plane of polarization is aligned at a predetermined angle relative to a fixed reference axis of the sensor element, and the reference axis being noticeable by a marking on a housing of the apparatus.

14. The apparatus measuring the polarization of light of claim 13, further comprising at least two polarization sensors, wherein at least one of the two sensors is configured as a unit of a polarization filter cooperating with a polarization sensor of which the plane of polarization is aligned at a predetermined angle relative to a fixed reference axis of the sensor element, and the reference axis being noticeable by a marking on a housing of the apparatus, with different alignments of the polarization planes, and wherein devices analyze the polarization of the incident light from the signals of the polarization sensors.

15. The apparatus according to claim 13, further comprising a plurality of polarization sensors, wherein the polarization sensors are configured and oriented in a way that they are appropriate to record an image containing data about the polarization of the incident light.

16. The apparatus according to claim 13, wherein the apparatus comprises at least one color filter.

17. The apparatus according to claim 13, wherein the angle of rotation between the polarized light source and the polarization sensor is determined from the polarization of the light source's light.

18. The apparatus according to claim 13, wherein a light source and a rotatable polarization filter are configured between the light source and the polarization sensor.

19. An apparatus for measuring an angle of polarized light, with a light source, a rotatable polarization filter and a reflecting medium, wherein the light source, the rotatable polarization filter and the reflecting medium are configured relative to each other in a manner that light emitted from the light source is reflected at the reflecting medium, passed through the rotatable polarization filter and detected by at least one polarization sensor of the apparatus, wherein the polarization sensitive filter includes at least one sensor element that is adapted to cooperate with the polarization sensor of which the plane of polarization is aligned at a predetermined angle relative to a fixed reference axis of the sensor element, and wherein the fixed reference axis is noticeable by a marking on a housing containing the polarization sensitive filter.

20. An apparatus to drive an actuator, with a light source, a rotatable polarization filter, a reflecting medium and a reference value input, wherein said light source, said rotatable polarization filter and said reflecting medium are configured relative to each other in a manner that light from the light source can be reflected at the reflecting medium, pass through the rotatable polarization filter and be detected by at least one polarization sensor, wherein the at least one polarization sensor is configured with apparatus driving an actuator and cooperating with it to compare the measured signal to a reference value, wherein the polarization sensitive filter includes at least one sensor element that is adapted to cooperate with the polarization sensor of which the plane of polarization is aligned at a predetermined angle relative to a fixed reference axis of the sensor element, and wherein the fixed reference axis is noticeable by a marking on a housing containing the polarization sensitive filter.

21. The apparatus to drive an actuator according to claim 20, wherein the at least one polarization sensor is integrated with the apparatus driving the actuator and comparing the measured signal to the reference value.

22. The apparatus for measuring an angle of polarized light according to claim 19, including at least one of means for electronic calibration and memories for storing calibration data.

23. The apparatus for measuring an angle of polarized light according to claim 22, including means for automated calibration.

24. The apparatus according to claim 13, further comprising a transparent medium and a polarized light source, wherein the polarized light from said source is detected by the polarization sensor after passing through the transparent medium.

* * * * *